United States Patent [19]
Au et al.

[11] Patent Number: 5,528,188
[45] Date of Patent: Jun. 18, 1996

[54] ELECTROSTATIC DISCHARGE SUPPRESSION CIRCUIT EMPLOYING LOW-VOLTAGE TRIGGERING SILICON-CONTROLLED RECTIFIER

[75] Inventors: Wai-Ming W. Au; Minh H. Tong, both of Essex Junction, Vt.

[73] Assignee: International Business Machines Corporation, Armonk, N.Y.

[21] Appl. No.: 402,793

[22] Filed: Mar. 13, 1995

[51] Int. Cl.⁶ .................................................. H02H 9/04
[52] U.S. Cl. ........................ 327/310; 327/428; 361/56
[58] Field of Search ................................. 257/363, 173; 361/111, 56, 91; 327/313, 310, 309, 428, 468

[56] References Cited

U.S. PATENT DOCUMENTS

| | | | |
|---|---|---|---|
| 3,603,843 | 9/1971 | Clements | 317/33 |
| 4,400,711 | 8/1983 | Avery | 357/43 |
| 4,870,530 | 9/1989 | Hurst et al. | 361/91 |
| 4,939,616 | 7/1990 | Rountree | 361/56 |
| 4,956,570 | 9/1990 | Gola et al. | 307/570 |
| 5,140,401 | 8/1992 | Ker et al. | 357/43 |
| 5,182,220 | 1/1993 | Ker et al. | 437/34 |
| 5,225,702 | 7/1993 | Chatterjee | 257/360 |
| 5,289,334 | 2/1994 | Ker et al. | 361/56 |
| 5,290,724 | 3/1994 | Leach | 437/51 |
| 5,345,357 | 9/1994 | Pianka | 361/56 |
| 5,359,211 | 10/1994 | Croft | 257/173 |
| 5,400,202 | 3/1995 | Metz et al. | 361/56 |
| 5,430,595 | 7/1995 | Wagner et al. | 361/56 |

OTHER PUBLICATIONS

Chattrjee et al., "A Low–Voltage Trigger SCR For On–Chip ESD Protection At Output and Input Pads", IEE Electron Device Letters, vol. 12, No. 1, pp. 6–7, Jan. 1991.

Primary Examiner—Timothy P. Callahan
Assistant Examiner—Terry L. Englund
Attorney, Agent, or Firm—Heslin & Rothenberg

[57] ABSTRACT

A resistance capacitance (RC) coupled low-voltage triggering silicon-controlled rectifier (LVTSCR) suppression circuit is presented for protecting an integrated circuit from electrostatic discharges or other potentially damaging voltage transients occurring at an input and/or output node of the integrated circuit or integrated circuit chip. The suppression circuit includes a discharge circuit and a trigger circuit. The discharge circuit is electrically coupled to the input and/or output node for dissipating the electrostatic discharge, while the trigger circuit is electrically connected to the input and/or output node and to the discharge circuit. The trigger circuit provides direct low-voltage turn-on of the discharge circuit as the electrostatic discharge builds at the input and/or output node of the integrated circuit. The trigger circuit includes a transistor having a control gate, and an RC circuit connected to the control gate and to the input and/or output node such that the control gate is electrically coupled to the input and/or output node across a capacitance and to ground across a resistance.

6 Claims, 4 Drawing Sheets

ELECTROSTATIC DISCHARGE SUPPRESSION CIRCUIT EMPLOYING LOW-VOLTAGE TRIGGERING SILICON-CONTROLLED RECTIFIER

TECHNICAL FIELD

This invention relates in general to protection of integrated circuits, and more particularly, to a resistance capacitance (RC) coupled low-voltage triggering silicon-controlled rectifier (LVTSCR) suppression circuit for protecting an integrated circuit from electrostatic discharges or other potentially damaging voltage transients occurring at an input and/or output node of the integrated circuit.

Background Art

Electrostatic discharge (ESD) is a phenomenon known to degrade or destroy electronic components. In particular, given the decreasing size of circuit features with ever improving process technology, static electricity can destroy or substantially harm many of today's integrated circuits. Electrostatic discharge can occur, for example, from human handling, automated circuit testing or as a packaged circuit slides on its pins across another surface. The circuits most susceptible to damage are unpackaged or packaged finished circuits which have not yet been installed into a finished product. Once installed, for example, onto a circuit card, other means exist to protect the circuits from damage.

Various techniques have been employed to protect integrated circuit chips handled by humans during the fabrication process. These methods include special handling procedures, use of grounding equipment, and the addition of protective components to the chip circuitry. Complementary metal-oxide semiconductor (CMOS) circuits are particularly subject to negative consequences of electrostatic discharges. In high density CMOS devices, an electrostatic discharge may develop an extremely high voltage which easily destroys the very thin gate oxides and very short channel devices of these circuits.

To protect CMOS devices against high voltages, a silicon-controlled rectifier (SCR) structure may be employed which is compatible with CMOS processing. FIG. 1 depicts one embodiment of a conventional SCR structure, denoted 10, compatible with CMOS processing. SCR 10 has a PNP bipolar transistor and an NPN bipolar transistor interconnected so that the emitter-collector circuit of each transistor conducts the base current for the other. When either transistor is turned on, it turns on the other and both stay on until the current is interrupted. Silicon-controlled rectifiers, such as SCR 10, have several advantages as ESD suppression circuits: they can handle high current; they have a low turn-on impedance; they dissipate low power; and they have a large volume for heat dissipation. Unfortunately, SCRs usually have a high turn-on voltage, which may be in a range that the suppression circuits should protect against. For example, the SCR structure of FIG. 1 turns on by development of a breakdown voltage across the N-well to substrate (P–) junction, which typically requires 15–50 volts. Such a voltage level is high for today's integrated circuits.

Due to this high SCR trigger voltage, a secondary ESD protection device is often employed in parallel when an SCR performs the primary ESD suppression function. For example, FIG. 2 depicts a secondary ESD protect device 12, comprising a resistor 14 and a series connected turn-on device 16, which is connected in parallel with an SCR 18 between an input and/or output pad 20 of an integrated circuit (not shown) and ground. In this configuration, turn-on device 16 could comprise a field-effect transistor (FET) or a reverse-biased diode. The overall suppression mechanism during occurrence of an ESD transient at the input and/or output pad (or node) is that secondary protect device 12 turns on first, and after the ESD current has increased to a certain level, the overall voltage drop across secondary ESD protect device 12 will trigger SCR 18. If turn-on device 16 comprises an FET, the triggering mechanism is a breakdown of the FET, which typically occurs at approximately seven volts for today's field-effect transistors. Thus, the turn-on voltage for SCR 18 is still somewhat high, i.e., greater than seven volts. Further, the addition of resistor 14 directly electrically connected to, for example, an output pad can degrade driver circuit performance, which is typically unacceptable in today's high speed circuit designs.

Recently, a low-voltage triggering silicon-controlled rectifier (LVTSCR) has been proposed, see for example Chatterjee et al., "A Low-Voltage Triggering SCR For On Chip ESD Protection At Output and Input Pads," IEEE EDL-12, No. 1, Jan. 1991. One embodiment of such an LVTSCR structure is depicted in FIG. 3. As shown, an N-channel field-effect transistor (NFET) is formed integral with (i.e., shares at least one semiconductor region with) the SCR. The control gate "G" and source "S" of the NFET are commonly connected to ground. In this implementation, the "snapback" mode of the FET is relied on for turn-on of the discharge circuit, i.e., the SCR. As is well known, the "snapback" phenomenon occurs by a triggering of the parasitic bipolar device of the FET.

More particularly, a voltage on pad 28 is directly coupled to the common N+ diffusion of the combined FET/SCR semiconductor device, i.e., the drain "D" of the FET in this embodiment. When sufficient voltage develops at the drain, the FET is triggered on, via the snapback phenomenon, notwithstanding that the transistor has a grounded control gate "G". In snapback mode, current flows through the FET, which will trigger the SCR. The SCR is triggered by the generated hole carriers originating from the grounded-gate breakdown of the FET. Since the grounded-gate breakdown voltage is relatively low, i.e., approximately seven volts, the SCR is triggered at a lower ESD voltage and thus the structure is referred to as a low-voltage triggering SCR. Unfortunately, for today's CMOS circuitry seven volts can be sufficient to breakdown gate oxide of the active devices. Thus, a need exists in the ESD suppression art for an even lower voltage triggered SCR.

Disclosure of Invention

Briefly summarized, the present invention comprises a suppression circuit for dissipating an electrostatic discharge occurring at an input and/or output node of an integrated circuit. The ESD suppression circuit includes a discharge circuit and a trigger circuit. The discharge circuit is electrically coupled to the input and/or output node for dissipating the electrostatic discharge, while the trigger circuit is electrically connected to both the input and/or output node and to the discharge circuit. The trigger circuit provides direct low-voltage turn-on of the discharge circuit as the electrostatic discharge builds at the input and/or output node of the integrated circuit, thereby preventing damage to the integrated circuit. The trigger circuit includes a transistor having a control gate, and a resistance capacitance (RC) circuit connected to the control gate and to the input and/or output node such that the control gate is electrically coupled to the input and/or output node across a capacitance and to ground across a resistance.

In another aspect, a suppression circuit in accordance with the present invention again includes a discharge circuit and a trigger circuit. In this implementation, the discharge circuit is electrically coupled to the input and/or output node for dissipating the electrostatic discharge. The discharge circuit includes a first silicon-controlled rectifier electrically coupled between the input and/or output node and Vdd, and a second silicon-controlled rectifier electrically coupled between the input and/or output node and ground of the integrated circuit. The trigger circuit is electrically coupled to the input and/or output node and to the first silicon-controlled rectifier and the second silicon-controlled rectifier. The trigger circuit provides direct low-voltage turn-on of either the first silicon-controlled rectifier or the second silicon-controlled rectifier with occurrence of an electrostatic discharge at the input and/or output node of the integrated circuit to thereby dissipate the electrostatic discharge and prevent damage to the integrated circuit. The trigger circuit includes a first transistor and a second transistor. The first transistor is formed integral with the first silicon-controlled rectifier and the second transistor is formed integral with the second silicon-controlled rectifier. The control gates of the first transistor and the second transistor are each electrically coupled to the input and/or output node across a capacitance and to ground across a resistance. Depending upon the polarity of an electrostatic discharge, either the first transistor or the second transistor turns-on with the electrostatic discharge to turn-on the first silicon-controlled rectifier or the second silicon-controlled rectifier, respectively.

In still another aspect, the invention comprises an integrated circuit chip. The integrated circuit chip includes an integrated circuit and multiple input and/or output pads coupled to the integrated circuit for external connection thereto. In this aspect, multiple electrostatic discharge suppression circuits are electrically coupled to the multiple input and/or output pads. Each electrostatic discharge suppression circuit includes a discharge circuit and a trigger circuit. The trigger circuit dissipates an electrostatic discharge at an input and/or output pad of the multiple input and/or output pads. The trigger circuit is electrically connected to the input and/or output pad and to the discharge circuit. This trigger circuit provides direct low-voltage turn-on of the discharge circuit with the electrostatic discharge at the input and/or output pad to thereby prevent damage to the integrated circuit. The trigger circuit includes a transistor having a control gate and a resistance capacitance circuit connected to the control gate and to the input and/or output pad such that the control gate is electrically coupled to the input and/or output pad across a capacitance and to ground across a resistance.

There are numerous advantages and features of a structure in accordance with the present invention. The novel suppression circuit of the present invention employs a low-voltage triggering silicon-controlled rectifier (LVTSCR). This suppression circuit provides protection against electrostatic discharges or potentially damaging voltage transients occurring at an input, an output or a power supply pad of an integrated circuit or integrated circuit chip. With the novel trigger circuit presented, ESD protection of active integrated circuits is ensured at lower voltages than otherwise attainable with prior approaches, and thus the level of ESD protection is higher. Further, there is no performance degradation resulting from addition of the trigger circuit. Due to the fast response of the RC-coupled LVTSCR to the ESD voltage rise time, the suppression circuit is extremely useful for protection against either machine or human induced ESD events. The triggering voltage is based on the low threshold voltage ($V_T$) of the FET device, and not on a grounded-gate breakdown voltage. This suppression circuit can readily provide ESD protection to different power supply levels, including voltage levels Vdd and Vss (ground).

BRIEF DESCRIPTION OF DRAWINGS

These and other objects, advantages and features of the present invention will be more readily understood from the following detailed description of certain preferred embodiments of the invention, when considered in conjunction with the accompanying drawings in which:

FIG. 4b is a schematic of the suppression circuit of FIG. 4a;

BEST MODE FOR CARRYING OUT THE INVENTION

Figure 3:
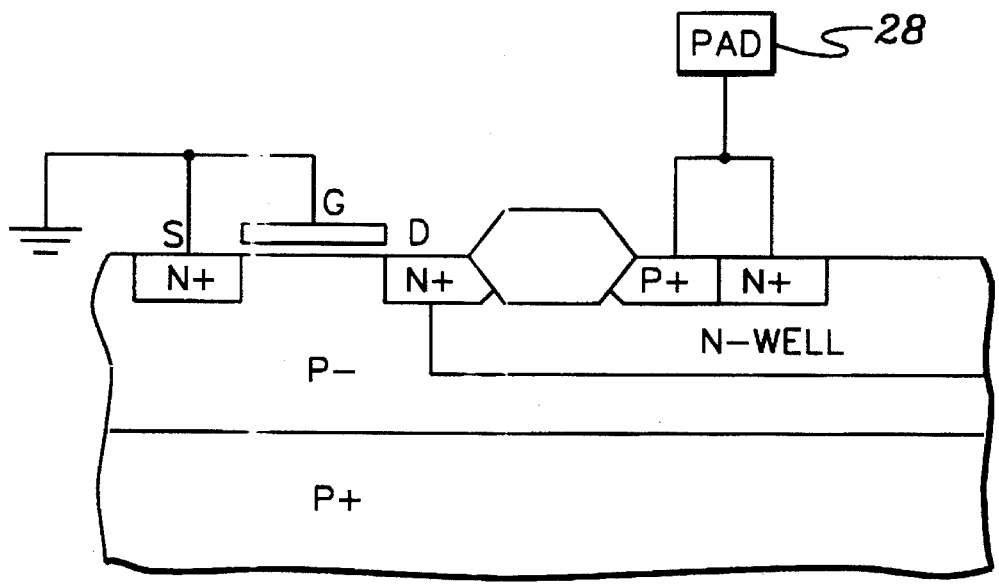
FIG. 3 is a partial cross-sectional view of another conventional suppression circuit comprising a low-voltage triggering silicon-controlled rectifier (LVTSCR)
Figure 4A:
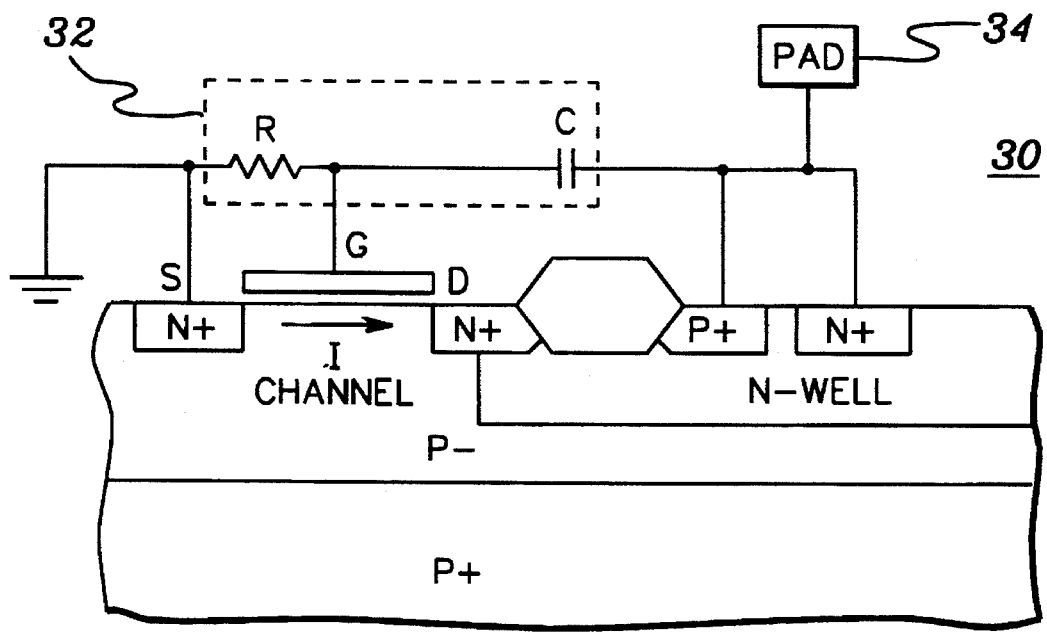
FIG. 4a is a partial cross-sectional, partial schematic view of a suppression circuit in accordance with the present invention.

FIG. 4a depicts a suppression circuit, generally denoted 30, in accordance with the present invention. Structurally circuit 30 includes an integrated SCR and FET device similar to that discussed above in connection with FIG. 3, and a resistance capacitance (RC) circuit 32 coupled to the gate "G" of the FET device. RC circuit 32 is also electrically connected to one of the multiple input pads, output pads, or input/output pads (herein collectively referred to as input and/or output pads) of an integrated circuit or integrated circuit chip with which the suppression circuit is associated. These pads may comprise signal pads, control pads, power pads, etc. As shown, RC circuit 32 includes a capacitance "C" that couples the gate "G" of the FET to at least one input and/or output pad (or node) 34, and a resistance "R" electrically connected between the gate "G" of the FET and ground (Vss). Multiple pads 34–34n may each have connected thereto a respective discharge circuit (40–40n) and an RC circuit (32–32n).

Figure 4B:
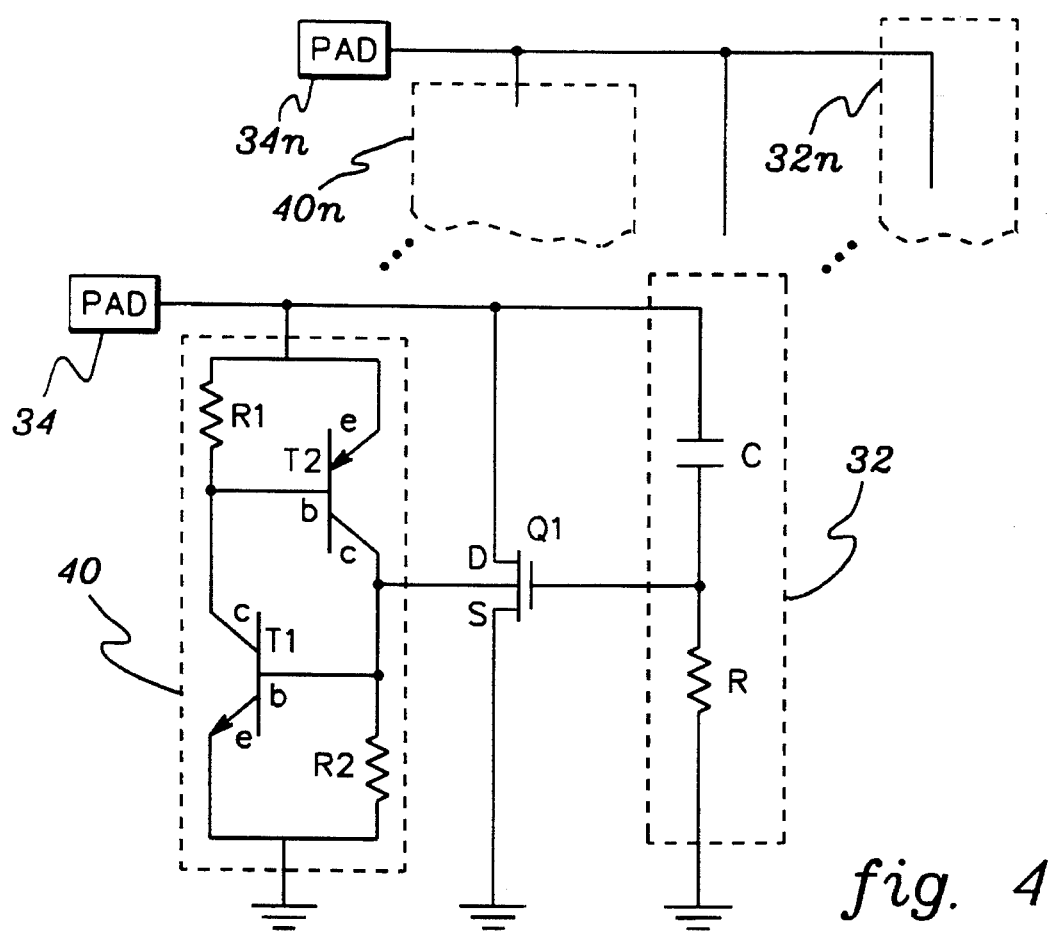

The electrical connections are depicted in greater detail in FIG. 4b, wherein circuitry 40 comprises the SCR, and transistor Q1 comprises the NFET transistor depicted in FIG. 4a. Within the SCR, transistor T1 is an NPN bipolar transistor of which the collector "c" comprises the N-well of FIG. 4a, the base "b" comprises the P– substrate, and the emitter "e" comprises the grounded N+ diffusion. Transistor T2 is a PNP bipolar device having an emitter "e" comprising the P+ diffusion within the N-well of FIG. 4a, a base "b"

comprising the N-well region and a collector "c" comprising the P− substrate region. Fabrication of the underlining LVTSCR structure depicted in FIG. 4a will be understood by one skilled in the art.

Figure 5:
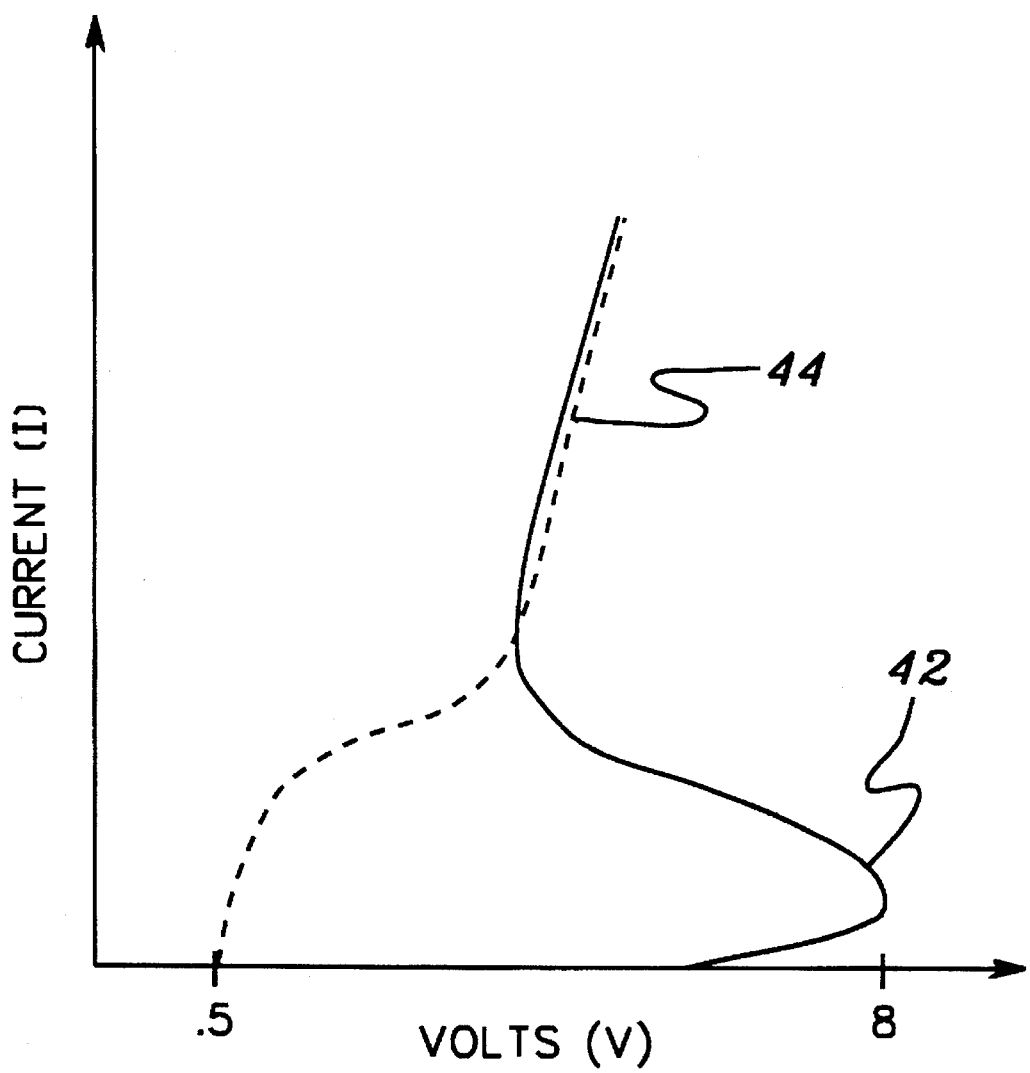
FIG. 5 depicts a characteristic graph for a prior art grounded-gate N-channel field-effect transistor (NFET) and a characteristic graph for an RC-coupled gate NFET for a suppression circuit in accordance with the present invention.

A significant difference between the prior art LVTSCR structure of FIG. 3 and that of the present invention depicted in FIG. 4a comprises the mode of operation of such suppression circuits. FIG. 5 depicts current-voltage characteristics for the grounded gate FET of FIG. 3 and the RC-coupled gate FET of FIG. 4a in accordance with the present invention. In particular, the solid line depicts operation of the grounded gate FET of FIG. 3, while the phantom line depicts operation of the RC-coupled gate FET of FIG. 4a. As noted above in connection with FIG. 3, the snapback phenonemon triggers that FET into a conducting state notwithstanding that its control gate "G" is grounded. Briefly explained, a voltage transient on pad 28 (FIG. 3) directly effects the voltage on the drain "D" diffusion of the FET. Thus, a high voltage on the pad will generate hole current (due to impact ionization) to flow through the substrate beneath the FET gate. This hole current in turn causes a potential greater than 0.7 volts beneath the gate which forward biases the grounded source "S" junction. Forward biasing of this junction injects electrons which are then collected by the N-well and when these electrons are sufficiently large, a negative potential is created at the P+ diffusion within the N-well. This potential forward biases the P+ N-well junction, thereby injecting additional holes into the N-well and hence the P− substrate. These additional holes ultimately force the PNPN SCR to trigger on.

By comparison, the RC-coupled LVTSCR in accordance with the present invention of FIG. 4b relies on direct turn-on of the FET through capacitive coupling of a transient voltage on pad 34 to the gate "G" of the FET. Upon turn-on of the FET, electron current flows within a current (I) channel beneath gate "G" between the drain "D" and source "S" diffusions. Impact ionization results in the generation of holes within the I channel and as shown by the characteristic in FIG. 5, the FET directly and smoothly transitions into a sustaining mode 44, with no snapback 42.

With a properly designed RC circuit 32, the FET device is "off" under normal operating conditions of the active integrated circuitry (not shown) connected to pad 34. However, during an ESD transient, the FET of the suppression circuit is turned "on" once the voltage at the FET gate exceeds the threshold voltage ($V_T$), e.g., 0.5 V. This threshold is quickly reached due to the fast dV/dt of the ESD pulse on pad 34 which is coupled to the gate across the capacitor "C". Thus, a significant attribute of this gate-coupled FET is its fast turn-on characteristic whenever an ESD event occurs at the input and/or output pad of the integrated circuit.

Figure 1:
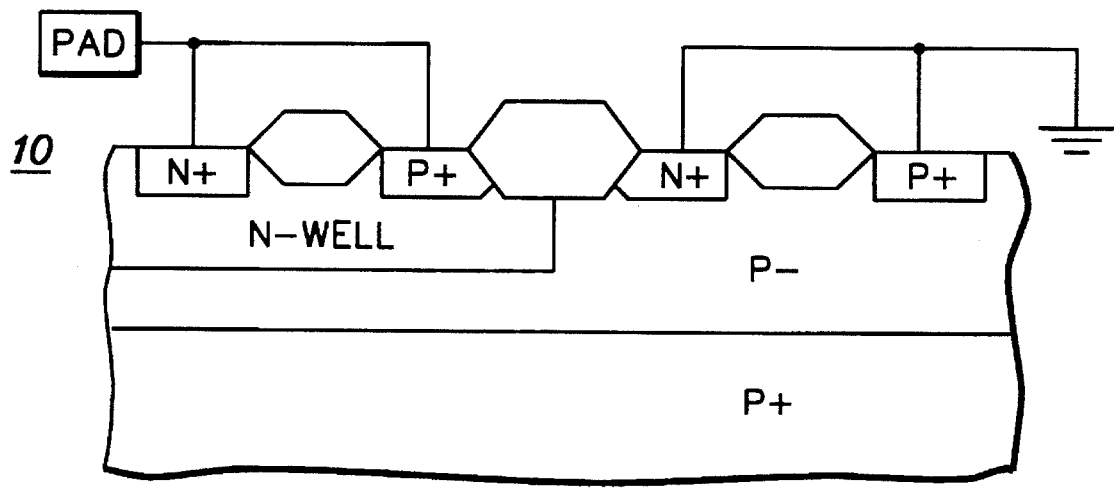
FIG. 1 is a partial cross-sectional view of a conventional silicon-controlled rectifier (SCR) semiconductor device.
Figure 2:
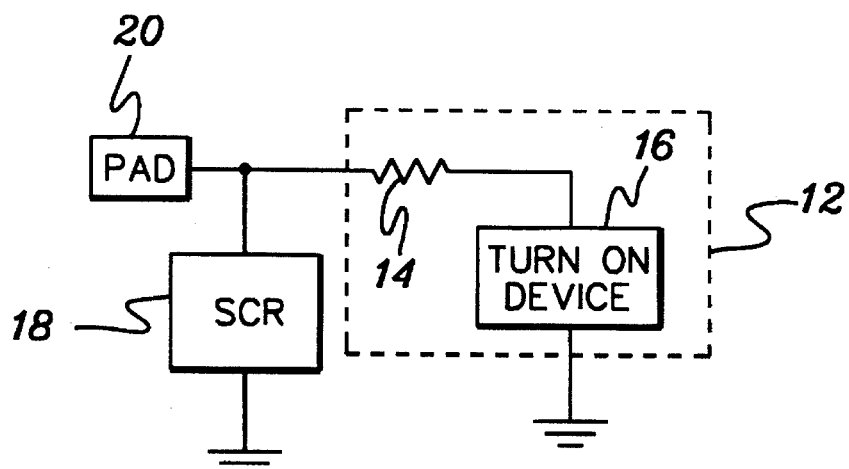
FIG. 2 is a simplified schematic of a conventional suppression circuit employing a silicon-controlled rectifier in parallel with a secondary protection circuit.

Once the FET is turned on, hole generation is initiated due to impact ionization of the channel current (I-channel) at the drain "D" region of the NFET. The hole carrier generation forms the base current for the SCR. So a significant feature of this invention is that the SCR is easily triggered by the low threshold voltage ($V_T$) of the NFET, not by the relatively high grounded-gate breakdown voltage as in the LVTSCR structure of FIG. 3. Further, it should be re-emphasized that the gate-coupled FET presented herein is not used in an ESD protect device as presented in FIG. 2, but rather, solely as a triggering device for the SCR. The SCR itself is the ESD discharge device that absorbs the ESD energy. Also, note that because this structure is operated based on the high dV/dt of an ESD voltage rise time, the structure will perform significantly better than other ESD structures, particularly for machine-induced ESD events.

Figure 6:
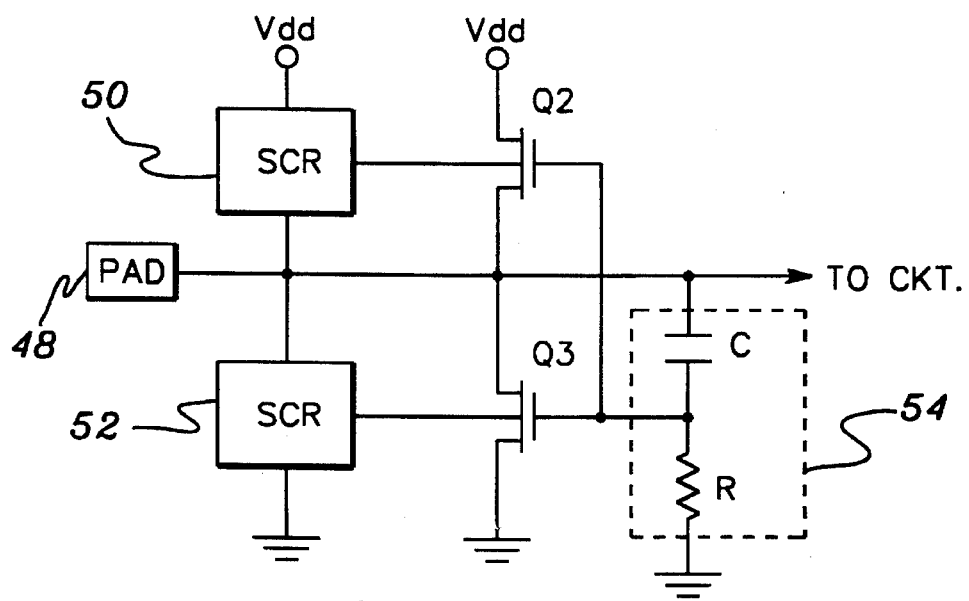
FIG. 6 is a schematic of an alternate embodiment of a suppression circuit in accordance with the present invention employing multiple SCRs and multiple RC-coupled gate FETs.

FIG. 6 schematically depicts another ESD suppression circuit in accordance with the present invention which protects an integrated circuit connected to an input/output pad 48 by providing a shunt path to ground through SCR 52 or a shunt path to supply voltage Vdd via SCR 50. The triggering mechanism for SCR 50 comprises an FET Q2 which has its gate connected to an RC-coupled circuit 54 in accordance with the present invention. Similarly, SCR 52 is triggered by transistor Q3 that is also gated by RC circuit 54. Operationally, the structure of FIG. 6 is analogous to that discussed above in connection with FIG. 4a & 4b, except provision is made for suppression of either a positive or a negative polarity ESD event.

The novel suppression circuit of the present invention employs a low-voltage triggering silicon-controlled rectifier. This suppression circuit provides protection against electrostatic discharges or potentially damaging voltage transients occurring at an input, an output or a power supply pad of an integrated circuit or integrated circuit chip. With the novel trigger circuit presented, ESD protection of active integrated circuits is ensured at lower voltages than otherwise attainable with prior approaches, and thus the level of ESD protection is higher. Further, there is no performance degradation resulting from addition of the trigger circuit. Due to the fast response of the RC-coupled LVTSCR to the ESD voltage rise time, the suppression circuit is extremely useful for protection against machine or human induced ESD events. The triggering voltage is based on the low threshold voltage ($V_T$) of the FET device, and not on a grounded-gate breakdown voltage. This suppression circuit can readily provide ESD protection pads to different power supply levels, such as Vdd and Vss (ground).

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

We claim:

1. A suppression circuit for dissipating an electrostatic discharge at an input and/or output node of an integrated circuit, said suppression circuit comprising:

a silicon-controlled rectifier discharge circuit electrically coupled to the input and/or output node for dissipating the electrostatic discharge; and a trigger circuit electrically connected to the input and/or output node and to the discharge circuit, said trigger circuit providing low-voltage turn-on of said discharge circuit as the electrostatic discharge builds at the input and/or output node of the integrated circuit to thereby prevent damage to the integrated circuit due to said electrostatic discharge, said trigger circuit including a transistor having a control gate, the transistor further having a substrate coupled to a control electrode of the silicon-controlled rectifier discharge circuit, the trigger circuit further including a passive resistance capacitance (RC) circuit connected to the control gate and to the input and/or output node such that said control gate is electrically coupled to the input and/or output node across a capacitance and to ground across a resistance, the passive RC circuit inhibiting turn-on of the discharge circuit during normal integrated circuit operation.

2. The suppression circuit of claim 1, wherein said transistor comprises a field-effect transistor, said field-effect transistor being connected to turn on with occurrence of said electrostatic discharge at the input and/or output node of the integrated circuit, turn-on of said field-effect transistor providing turn-on of said silicon-controlled rectifier discharge circuit.

3. The suppression circuit of claim 1, wherein said integrated circuit comprises an integrated circuit chip.

4. A suppression circuit for dissipating an electrostatic discharge at an input and/or output node of an integrated circuit, said suppression circuit comprising:

a discharge circuit electrically coupled to the input and/or output node for dissipating the electrostatic discharge, said discharge circuit including a first silicon-controlled rectifier and a second silicon-controlled rectifier, said first silicon-controlled rectifier being electrically coupled between the input and/or output node and a (Vdd) voltage supply node of the integrated circuit, and said second silicon-controlled rectifier being electrically coupled between the input and/or output node and a (Vss) voltage supply node of the integrated circuit; and a trigger circuit electrically connected to the input and/or output node and to the first silicon-controlled rectifier and the second silicon-controlled rectifier of the discharge circuit, said trigger circuit providing low-voltage turn-on of one of said first silicon-controlled rectifier and said second silicon-controlled rectifier in response to the electrostatic discharge occurring at the input and/or output node of the integrated circuit to thereby dissipate the electrostatic discharge and prevent damage to the integrated circuit, said trigger circuit including a first transistor and a second transistor, a substrate of said first transistor being coupled to a control electrode of the first silicon-controlled rectifier and a substrate of said second transistor being coupled to a control electrode of the second silicon-controlled rectifier, a control gate of said first transistor and a control gate of said second transistor each being electrically coupled to the input and/or output node across a capacitance and to ground across a resistance, the capacitance and resistance forming a passive circuit, whereby depending upon the polarity of said electrostatic discharge, either said first transistor or said second transistor turns-on with said electrostatic discharge to turn on the first silicon-controlled rectifier or the second silicon-controlled rectifier, respectively, the passive circuit inhibiting turn-on of the first and second transistors during normal integrated circuit operation.

5. The suppression circuit of claim 4, wherein said integrated circuit comprises an integrated circuit chip having multiple input and/or output nodes, and wherein said suppression circuit is electrically coupled to at least one of said multiple input and/or output nodes for suppression of an electrostatic discharge occurring thereat.

6. An integrated circuit chip comprising:

an integrated circuit;

multiple input and/or output pads coupled to the integrated circuit for external connection thereto; and multiple electrostatic discharge suppression circuits electrically coupled to said multiple input and/or output pads, each electrostatic discharge suppression circuit including a silicon-controlled rectifier discharge circuit for dissipating an electrostatic discharge at a respective input and/or output pad of said multiple input and/or output pads, and a trigger circuit electrically connected to said respective input and/or output pad and to said respective discharge circuit, said trigger circuit providing low-voltage turn-on of said respective discharge circuit with the electrostatic respective discharge at said input and/or output pad to thereby dissipate the electrostatic discharge and prevent damage to the integrated circuit, said trigger circuit including a transistor having a control gate, the transistor further having a substrate coupled to a control electrode of the silicon-controlled rectifier discharge circuit, the trigger circuit further including a passive resistance capacitance (RC) circuit connected to the control gate and to said respective input and/or output pad such that said control gate is electrically coupled to the respective input and/or output pad across a capacitance and to ground across a resistance, the passive RC circuit inhibiting turn-on of the respective discharge circuit during normal integrated circuit operation.

\* \* \* \* \*

UNITED STATES PATENT AND TRADEMARK OFFICE
CERTIFICATE OF CORRECTION

PATENT NO.   :   5,528,188
DATED        :   Jun. 18, 1996
INVENTOR(S)  :   Au et al.

It is certified that error appears in the above-indentified patent and that said Letters Patent is hereby corrected as shown below:

Column 7, lines 14 & 15, between "a" and "(Vdd)" insert --high--.

Column 7, line 18, after "a" insert --low--.

Column 8, lines 26 & 27, between "said" and "input" insert --respective--.

Signed and Sealed this

Fifth Day of November, 1996

Attest:

BRUCE LEHMAN

Attesting Officer         Commissioner of Patents and Trademarks